United States Patent [19]

Kim

[11] Patent Number: 5,753,562
[45] Date of Patent: May 19, 1998

[54] METHODS OF FORMING SEMICONDUCTOR DEVICES IN SUBSTRATES HAVING INVERTED-TRENCH ISOLATION REGIONS THEREIN

[75] Inventor: Hyoung-sub Kim, Kyungki-do, Rep. of Korea

[73] Assignee: Samsung Electronics Co., Ltd., Suwon, Rep. of Korea

[21] Appl. No.: 766,781

[22] Filed: Dec. 13, 1996

[30] Foreign Application Priority Data

Sep. 5, 1996 [KR] Rep. of Korea ............... 96 38456

[51] Int. Cl.$^6$ ............................................. H01L 21/76
[52] U.S. Cl. ................... 438/424; 438/435; 438/459; 438/221; 438/296; 438/977
[58] Field of Search ........................ 438/424, 435, 438/459, 221, 296, 977

[56] References Cited

U.S. PATENT DOCUMENTS

| | | | |
|---|---|---|---|
| 4,851,366 | 7/1989 | Blanchard | 438/405 |
| 5,618,752 | 4/1997 | Gaul | 438/626 |
| 5,627,106 | 5/1997 | Hsu | 438/459 |

OTHER PUBLICATIONS

Haisma et al., Silicon–on–Insulator Wafer Bonding–Wafer Thinning Technological Evaluations, Japanses Journal of aplied Physics, vol. 28, #8, (1989), pp. 1433–1434, Apr. 10, 1989.

Primary Examiner—John Niebling
Assistant Examiner—David A. Zarneke
Attorney, Agent, or Firm—Myers Bigel Sibley & Sajovec

[57] ABSTRACT

Methods of forming semiconductor substrates having inverted-trench isolation regions therein include the steps of forming at least one trench in a semiconductor substrate at a first face thereof and then forming a stopping layer on the bottom of the trench. An etching or polishing step is then performed on a second face of the substrate which extends opposite the first face, until the stopping layer is exposed. Semiconductor devices are then formed in the remaining portions of the substrate extending adjacent sidewalls of the trench, at the polished second face. In particular, first and second trenches are preferably formed at a first face of a first semiconductor substrate and then respective first and second stopping layers comprising silicon nitride are formed on bottoms of the first and second trenches. First and second electrically insulating layers (e.g., $SiO_2$) are then formed on the first and second stopping layers, to fill the first and second trenches. The electrically insulating layers are then polished using a chemical-mechanical polishing step to form a substantially planar surface to which a second substrate is preferably bonded. A second face of the first substrate, extending opposite the first face, is then polished until the stopping layers are exposed and a smooth semiconductor surface is defined extending between the first and second trenches. Semiconductor devices are then formed in the substrate, opposite the smooth semiconductor surface and between the insulation-filled trenches.

11 Claims, 3 Drawing Sheets

METHODS OF FORMING SEMICONDUCTOR DEVICES IN SUBSTRATES HAVING INVERTED-TRENCH ISOLATION REGIONS THEREIN

FIELD OF THE INVENTION

The present invention relates to semiconductor devices and methods of fabrication, and more particularly to methods of forming semiconductor substrates having electrically isolated active regions therein.

BACKGROUND OF THE INVENTION

For highly integrated circuits, shallow trench isolation (STI) techniques are typically preferred over conventional local oxidation of silicon (LOCOS) isolation techniques. This preference is typically due to the fact that LOCOS techniques typically include the parasitic formation of bird's beak oxide extensions which can take up valuable surface area and limit device integration levels. Shallow trench isolation techniques typically involve the formation of a plurality of oxide-filled trenches in a semiconductor substrate. These oxide-filled trenches typically define a plurality of device active regions which extend between adjacent trenches.

One attempt at using shallow trench isolation techniques to define active regions of a DRAM memory device is illustrated by FIGS. 1–5. In particular, FIG. 1 illustrates the steps of forming a pad oxide film 12, a nitride film 14 and a first oxide film 16 on a semiconductor substrate 10. These layers are then patterned to define a mask 17 for exposing inactive portions of the substrate 10. An anisotropic etching step is then performed using the mask 17 to define a plurality of trenches 18. As illustrated FIG. 2, an oxide film 20 is then formed on sidewalls and bottoms of the trenches 18 and then the trenches 18 are filled with an oxide layer. A chemical-mechanical polishing (CMP) step is then performed to define a plurality of electrical isolation regions 22. Here, the nitride film 14 is used as a polish stop. The nitride film 14 and pad oxide film 12 are then removed and a sacrificial oxide film 24 is then formed on the active regions of the substrate. Threshold-voltage adjust dopants 26 are then implanted through the sacrificial oxide film 24, as illustrated by FIG. 3. Referring now to FIG. 4, the sacrificial oxide film 24 is then eliminated and a gate oxide film 28 is formed on the active regions. Unfortunately, during the formation and the subsequent elimination of the sacrificial oxide film 24, grooves may be formed in the isolation regions 22. These grooves are illustrated by regions "A" and may have a depth and width of about 500 Å. As will be understood by those skilled in the art, the formation of the grooves "A" is typically caused by the fact that the difference in etching rates between the isolation regions 22 and oxide film 24 is not significant.

Accordingly, the grooves illustrated by regions "A" may trap gate electrode material during the subsequent step of depositing a polycrystalline silicon layer. If not removed, this trapped gate electrode material may cause the formation of electrical "bridges" and "shorts" between adjacent electrodes and structures. As illustrated by FIG. 5, the deposited layer of polycrystalline silicon is then patterned to form a plurality of gate electrodes 30. A layer of oxide 32 may then be deposited to electrically insulate the gate electrodes 30. Contact holes 34 may then be formed to expose portions of the active regions at the face of the substrate. However, if these contact holes are misaligned, the etching step used to form the contact holes may also cause an increase in the size of the grooves, as illustrated by regions "B". In the case of DRAM memory cells having storage electrodes coupled to substrate contact regions in the vicinity of regions "B", the presence of regions "B" can cause an increase in charge leakage and reduce the refresh cycle time associated with the repeated charging of the storage electrode.

Thus, notwithstanding the above described attempt to using shallow trench isolation to achieve more highly integrated circuits, there still continues to be a need for improved methods which are less susceptible to the above-described parasitic grooves adjacent the sidewalls of the trench isolation regions.

SUMMARY OF THE INVENTION

It is therefore an object of the present invention to provide improved methods of forming semiconductor substrates for integrated circuit device processing.

It is another object of the present invention to provide improved methods of forming electrically isolated active regions in a semiconductor substrate.

It is still another object of the present invention to provide methods of forming electrically isolated active regions which are suitable for processing highly integrated electronic circuits.

These and other objects, features and advantages of the present invention are provided by methods of forming semiconductor substrates having inverted-trench isolation regions therein which provide improved electrical isolation of active regions and are compatible with methods of processing highly integrated circuits. A method of forming a substrate having inverted-trench isolation regions therein according to the present invention includes the steps of forming at least one trench in a semiconductor substrate at a first face thereof and then forming a stopping layer on the bottom of the trench. An etching or polishing step is then performed on a second face of the substrate which extends opposite the first face, until the stopping layer is exposed. Semiconductor devices are then formed in the remaining portions of the substrate extending adjacent sidewalls of the trench, at the polished second face.

In particular, according to one embodiment of the present invention, first and second trenches are formed at a first face of a first semiconductor substrate and then respective first and second stopping layers comprising silicon nitride are formed on bottoms of the first and second trenches. First and second electrically insulating layers (e.g., $SiO_2$) are then formed on the first and second stopping layers, to fill the first and second trenches. The electrically insulating layers are then polished using a chemical-mechanical polishing step to form a substantially planar surface to which a second substrate is preferably bonded. A second face of the first substrate, extending opposite the first face, is then polished until the stopping layers are exposed and a smooth semiconductor surface is defined extending between the first and second trenches. Semiconductor devices are then formed in the substrate, opposite the smooth semiconductor surface and between the insulation-filled trenches.

DESCRIPTION OF PREFERRED EMBODIMENTS

Figure 1:
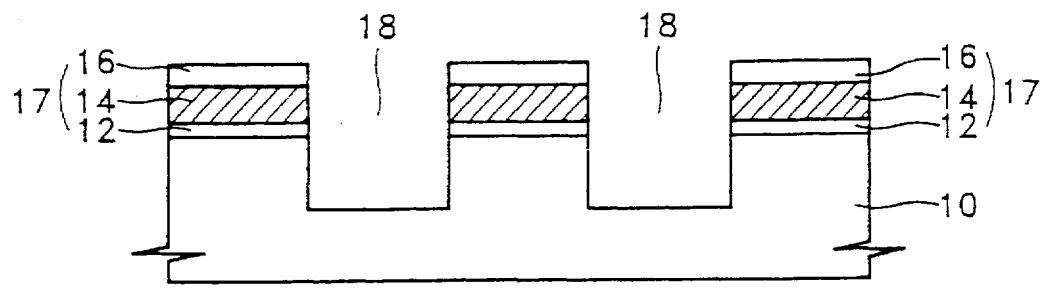
FIGS. 1–5 illustrate schematic cross-sectional views of intermediate structures illustrating a conventional method of forming trench-isolated active regions in a semiconductor substrate.
Figure 2:
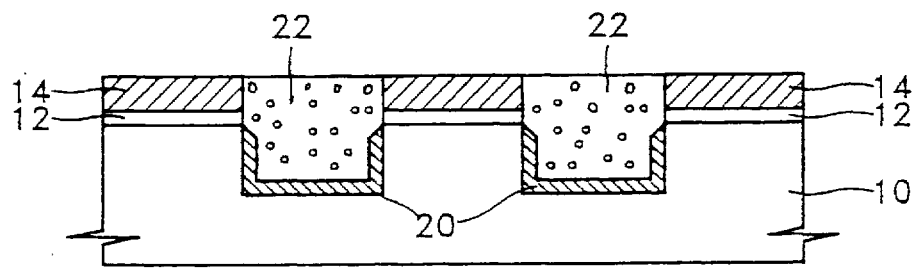
Figure 3:
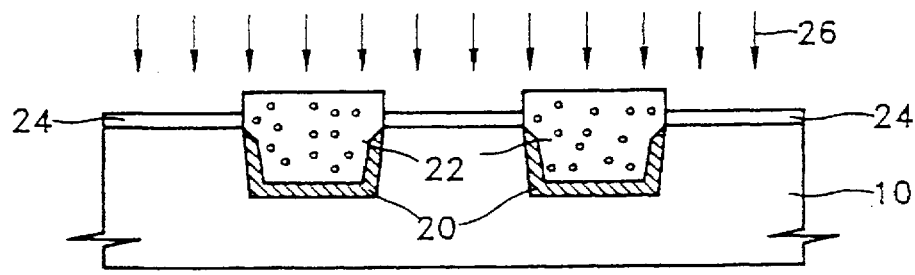
Figure 4:
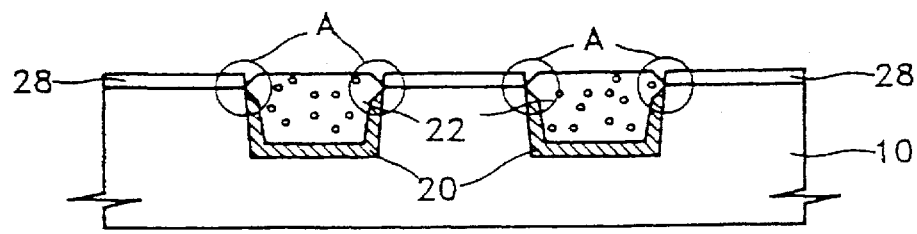
Figure 5:
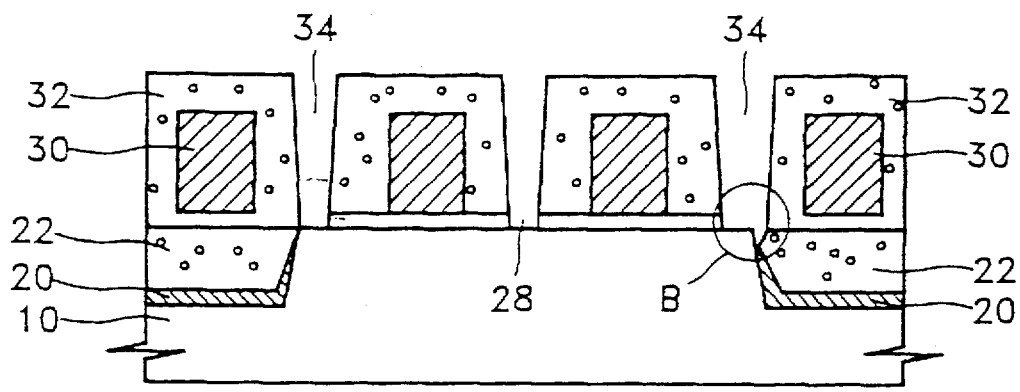
Figure 6:
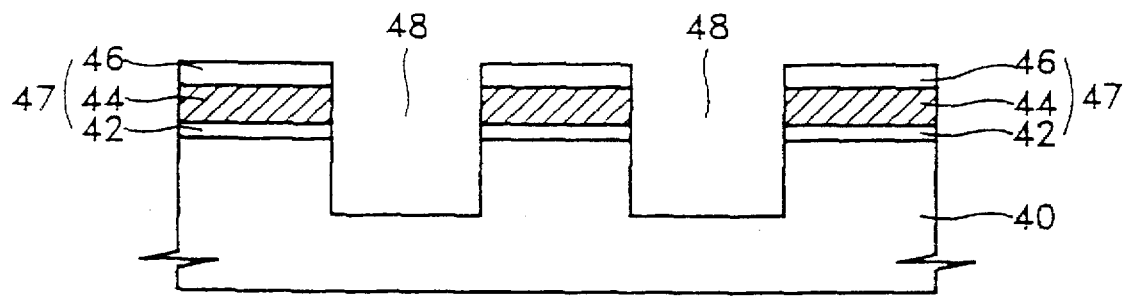
FIGS. 6–9 illustrate schematic cross-sectional views of intermediate structures illustrating a method of forming inverted-trench isolation regions in a semiconductor substrate, according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type and each embodiment described and illustrated herein includes its complementary embodiment as well.

Referring now to FIGS. 6–9, preferred methods of forming semiconductor substrates having inverted-trench isolation regions therein will now be described. As illustrated best by FIG. 6, a method according to a first embodiment of the present invention includes the steps of forming a first pad oxide layer 42, a first nitride layer 44 and an oxide capping layer 46 in sequence on a first face of a semiconductor substrate 40 of predetermined conductivity type (e.g., P-type). The pad oxide layer 42, first nitride layer 44 and oxide capping layer 46 are then patterned using a mask (not shown) to form a pattern 47 which can then be used as an etching mask. In particular, a plurality of trenches 48 are preferably formed by anisotropically etching the substrate 40 using the pattern 47 as an etching mask. The trenches 48 may be formed to have depth in a range between 2000 and 20,000 Å, depending on the thickness of the substrate 40 and degree of electrical isolation required.

Figure 7:
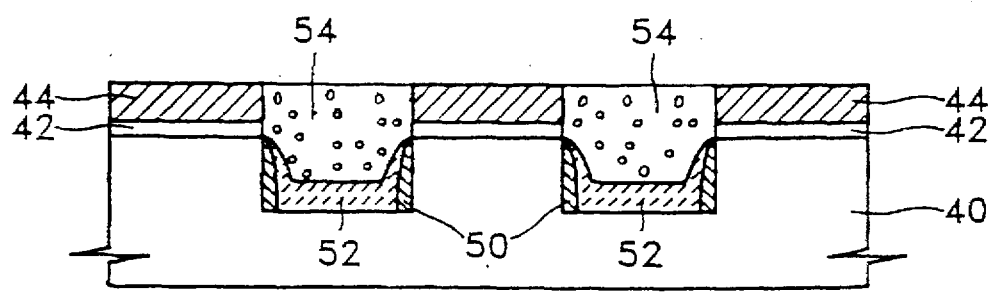

Referring now to FIG. 7, sidewall oxide spacers 50 are preferably formed on sidewalls of the trenches 48. The sidewall spacers 50 may be formed by depositing a layer of oxide into the trenches and then performing a dry etching step (e.g., RIE) to remove portions of the deposited layer of oxide from bottoms of the trenches 48. Here, the sidewall spacers 50 may be formed to have thicknesses in a range between 100 and 200 Å. A second nitride layer 52 is then formed on the bottoms of the trenches 48 and on the sidewall spacers 50, as illustrated. According to one aspect of the present invention, the second nitride layer 52 may be formed by depositing a layer of silicon nitride and then etching the deposited nitride layer using conventional techniques. Preferably, the second nitride layer 52 is formed to have a resulting thickness in a range between 500 and 5000 Å.

Referring still to FIG. 7, the trenches 48 are then filled with an electrically insulating layer (e.g., SiO$_2$). For example, a relatively thick blanket layer of oxide may be deposited to fill the trenches 48 and cover the pattern 47. An etching or polishing step is then performed to planarize the electrically insulating layer and form an isolation region 54. Here, chemical-mechanical polishing (CMP) may be used to polish the electrically insulating layer and oxide capping layer 46 until the patterned first layer of nitride 44 is exposed. As will be understood by those skilled in the art, the first layer of nitride 44 acts as a polishing stop during the CMP step.

Figure 8:
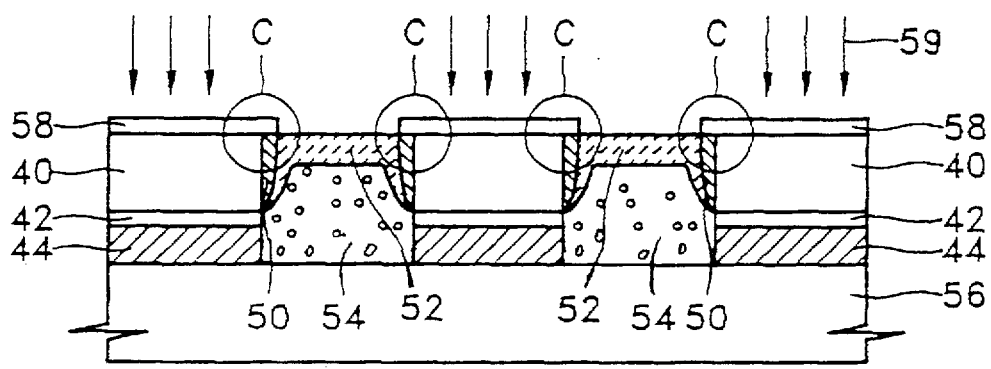
Figure 9:
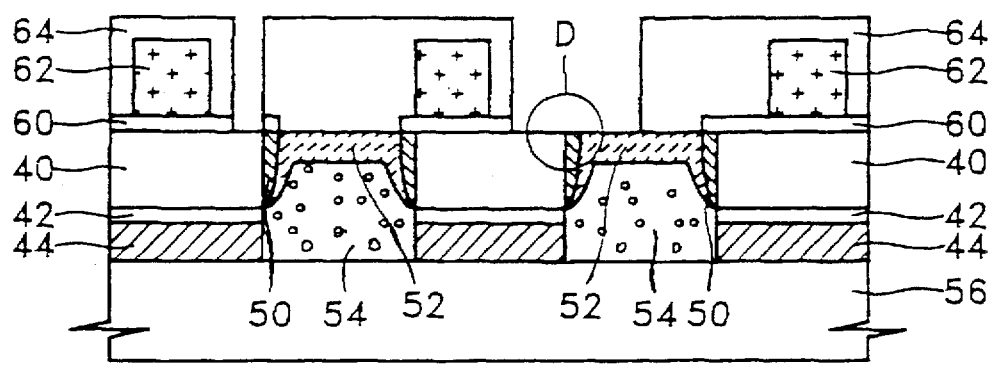

Referring now to FIG. 8, the semiconductor substrate 40 is then flipped to expose the second face thereof and then a supporting substrate 56 is bonded to a face of the polished electrically insulating layer and to the exposed first layer of nitride 44. The supporting substrate 56 may comprise an electrically insulating or semiconductor substrate, as will be understood by those skilled in the art. The second face of the semiconductor substrate 40 is then etched or planarized by performing a chemical-mechanical polishing (CMP) step until the second nitride layer 52 and sidewall spacers 50 are exposed. Here, the second nitride layer 52 acts as a polishing stop to define a polished face of the semiconductor substrate 40. As will be understood by those skilled in the art, the portions of the substrate 40 extending between adjacent trenches can be used as a plurality of active regions which are electrically isolated from each other by the inverted-trench regions. As illustrated, when viewed in transverse cross-section, the active regions are preferably surrounded by layers 42 and 50 of silicon dioxide.

Referring still to FIG. 8, a sacrificial oxide layer 58 may then be formed on the polished face of the substrate 40 and a threshold-adjust implant step may be performed by implanting dopant ions 59 through the sacrificial layer 58 which acts to inhibit surface implant damage. A wet etching step may also be performed to then remove the sacrificial oxide layer 58. As illustrated best by FIG. 9, semiconductor devices can then be formed in the active regions of the substrate 40. For example, insulated electrodes of field effect transistors (FETs) or DRAM memory cells may be formed by depositing an electrode insulating layer 60 on the polished face and then patterning a plurality of electrodes 62 on the insulating layer 60. A blanket insulating layer 64 (e.g., SiO$_2$) is then formed on the patterned electrodes 62. Electrical contact to active regions of an FET or DRAM cell can then be made by forming contact holes in the blanket insulating layer 64. However, in contrast to the prior art, a uniform interface, as best illustrated by regions C and D in FIGS. 8 and 9, respectively, can be more readily achieved by preventing the isolation region 54 from being exposed during the step of polishing the second face of the substrate or etching the blanket insulating layer 64. Moreover, even in the event a groove is formed during the step of forming contact holes in the blanket insulating layer 64, the width of the groove is typically limited to only the thickness of the sidewall spacers 50.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a semiconductor substrate having an inverted-trench isolation region therein, comprising the steps of:

forming a trench in a semiconductor substrate at a first face thereof;

forming a nitride layer in contact with a bottom of the trench;

forming an electrically insulating layer on the nitride layer to thereby at least partially fill the trench;

planarizing the electrically insulating layer;

bonding a second semiconductor substrate to the planarized electrically insulating layer; and chemically-mechanically polishing the semiconductor substrate at a second face thereof, which extends opposite the first face, to expose the nitride layer.

2. The method of claim 1, wherein said trench forming step is preceded by the step of patterning a first mask on the first face of the substrate to expose a first portion thereof; and wherein said trench forming step comprises etching the exposed first portion of the substrate.

3. The method of claim 2, wherein said step of patterning a first mask comprises the steps of:

forming a pad oxide layer on the first face of the substrate;

forming a masking layer on the pad oxide layer, opposite the first face; and etching the masking layer and the pad oxide layer to expose the first portion of the face.

4. The method of claim 3, wherein said step of forming an electrically insulating layer comprises depositing a layer of oxide into the trench; and wherein said step of planarizing the electrically insulating layer comprises chemically-mechanically polishing the layer of oxide using the masking layer as a polishing stop.

5. The method of claim 4, wherein said nitride layer forming step is preceded by the step of forming sidewalls spacers comprising silicon dioxide on sidewalls of the trench.

6. The method of claim 5, wherein said sidewall spacers forming step comprises forming sidewall spacers having a thickness in a range between about 100 and 200 Å on the sidewalls of the trench; and wherein said nitride layer forming step comprises forming a nitride layer having a thickness in a range between about 500 and 5000 Å on the bottom of the trench.

7. A method of forming a semiconductor device adjacent an inverted trench isolation region, comprising the steps of:

forming first and second trenches at a first face of a first semiconductor substrate;

forming respective first and second nitride stopping layers in contact with bottoms of the first and second trenches;

forming a second substrate on the first face of the first semiconductor substrate;

chemically-mechanically polishing the first semiconductor substrate at a second face thereof which extends opposite the first face, using the first and second stopping layers as polishing stops; and forming a semiconductor device at the polished second face of the first semiconductor substrate, between the first and second stopping layers.

8. The method of claim 7, wherein said step of forming first and second nitride stopping layers is followed by the steps of:

forming first and second electrically insulating layers on the first and second nitride stopping layers, respectively, to fill the first and second trenches; and chemically-mechanically polishing the first and second electrically insulating layers.

9. The method of claim 8, wherein said step of forming a semiconductor device comprises the steps of:

forming a sacrificial oxide layer on the polished second face;

implanting threshold-adjust dopants through the sacrificial oxide layer and into the polished second face; and forming an insulated gate electrode on the polished second face.

10. The method of claim 9, wherein said step of forming first and second nitride stopping layers in contact with bottoms of the first and second trenches is preceded by the step of forming sidewall spacers comprising silicon dioxide on sidewalls of the first and second trenches.

11. The method of claim 10, wherein said step of chemically-mechanically polishing the first semiconductor substrate at the second face comprises chemically-mechanically polishing the first semiconductor substrate at the second face to expose the first and second nitride stopping layers and the sidewall spacers.

* * * * *